(12) United States Patent
Cruijssen et al.

(10) Patent No.: US 10,340,843 B2
(45) Date of Patent: Jul. 2, 2019

(54) SOLAR PANEL WITH FLEXIBLE OPTICAL ELEMENTS

(71) Applicant: Airbus Defence and Space Netherlands B.V., Leiden (NL)

(72) Inventors: Johan Hendrik Cruijssen, Alphen aan den Rijn (NL); Petrus Cornelis Datema, Hoofddorp (NL)

(73) Assignee: Airbus Defence and Space Netherlands B.V., Leiden (NL)

(*) Notice: Subject to any disclaimer, the term of this patent is extended or adjusted under 35 U.S.C. 154(b) by 143 days.

(21) Appl. No.: 15/255,172

(22) Filed: Sep. 2, 2016

(65) Prior Publication Data

US 2017/0063296 A1 Mar. 2, 2017

(30) Foreign Application Priority Data

Sep. 2, 2015 (NL) .................................. 2015387

(51) Int. Cl.
*B64G 1/44* (2006.01)
*H02S 40/22* (2014.01)
(Continued)

(52) U.S. Cl.
CPC .............. *H02S 40/22* (2014.12); *B64G 1/222* (2013.01); *B64G 1/443* (2013.01);
(Continued)

(58) Field of Classification Search
CPC ..... H02S 40/22; H02S 30/20; H01L 31/0547; B64G 1/222; B64G 1/44; B64G 1/443; F24S 40/10
See application file for complete search history.

(56) References Cited

U.S. PATENT DOCUMENTS 3,326,497 A   6/1967   Michelson
3,327,967 A   6/1967   Schrantz
(Continued)

FOREIGN PATENT DOCUMENTS

FR   2768402 A1   3/1999
JP   H084146 B    1/1996

OTHER PUBLICATIONS

NL 2015387 Written Opinion, dated May 17, 2016.
EP 16186953.2 Search Report, dated Jan. 26, 2017.

*Primary Examiner* — Philip J Bonzell
(74) *Attorney, Agent, or Firm* — N.V. Nederlandsch Octrooibureau; Catherine A. Shultz; Tamara C. Stegmann

(57) ABSTRACT

A solar array (50) for a spacecraft (10), comprising a solar concentrator that is provided with photovoltaic cells and reflective areas configured for reflecting solar radiation towards the photovoltaic cells, wherein the reflective areas and the photovoltaic cells are provided on opposite surfaces of concentrator reflector sheet members (56) that are repositionable from a retracted state wherein the concentrator reflector sheet members are in a substantially flat arrangement, to a extended state wherein the concentrator reflector sheet members are raised to allow the reflective areas to reflect solar radiation towards the exposed photovoltaic cells.
Alternatively or in addition, the solar array may comprise a support panel, which may be at least partially flexible for retaining the support panel in a bent panel shape when the solar array is in the stowed state fixed at a position near a body of the spacecraft.

19 Claims, 12 Drawing Sheets

(51) Int. Cl.
    *H02S 30/10*     (2014.01)
    *H02S 20/32*     (2014.01)
    *H02S 30/20*     (2014.01)
    *B64G 1/22*     (2006.01)
    *H01L 31/054*     (2014.01)
    *F24S 40/10*     (2018.01)

(52) U.S. Cl.
    CPC .......... *H01L 31/0547* (2014.12); *H02S 20/32* (2014.12); *H02S 30/10* (2014.12); *H02S 30/20* (2014.12); *F24S 40/10* (2018.05); *Y02E 10/52* (2013.01)

(56) References Cited

U.S. PATENT DOCUMENTS

| | | | |
|---|---|---|---|
| 3,982,527 A * | 9/1976 | Cheng | F24S 23/71 |
| | | | 126/690 |
| 4,143,640 A | 3/1979 | Pierce | |
| 4,153,474 A | 5/1979 | Rex | |
| 4,690,355 A * | 9/1987 | Hornung | B64G 1/222 |
| | | | 244/172.8 |
| 5,131,955 A * | 7/1992 | Stern | B64G 1/443 |
| | | | 136/245 |
| 5,180,441 A * | 1/1993 | Cornwall | F24S 23/74 |
| | | | 136/246 |
| 5,344,496 A * | 9/1994 | Stern | H01L 31/0547 |
| | | | 136/246 |
| 9,004,410 B1 * | 4/2015 | Steele | B64G 1/443 |
| | | | 244/172.7 |
| 9,079,673 B1 | 7/2015 | Steele et al. | |

\* cited by examiner

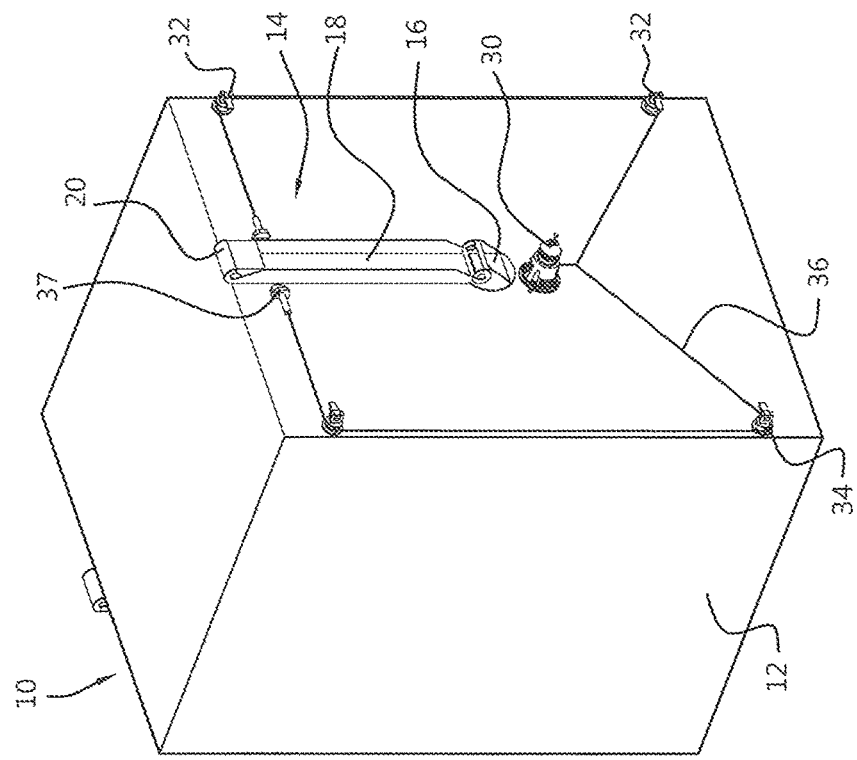
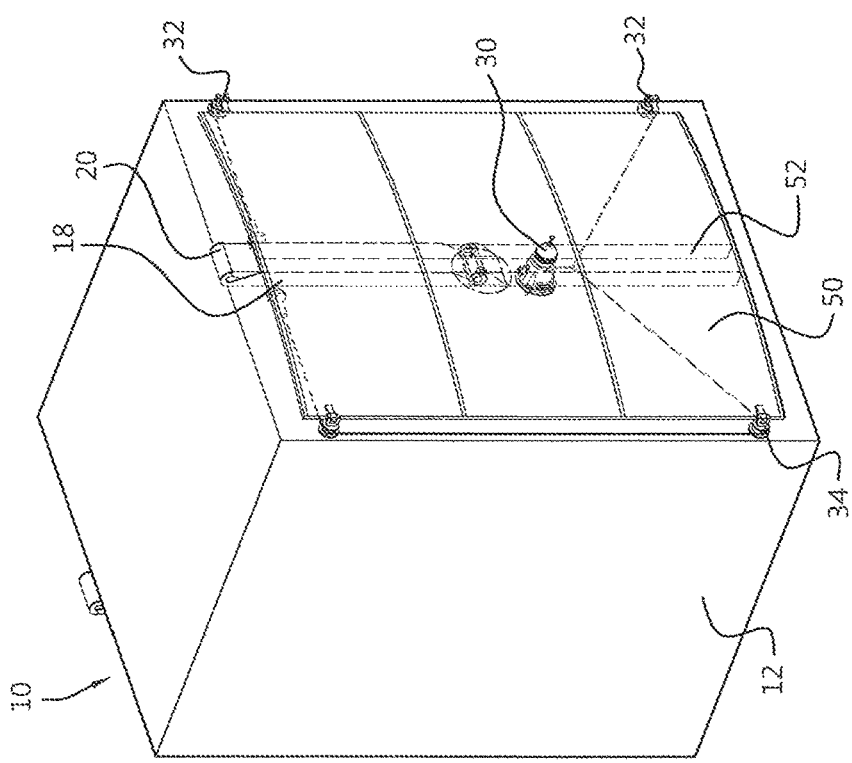

Fig. 6a
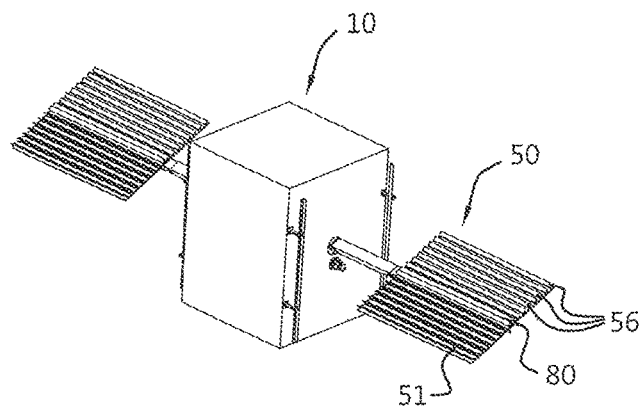
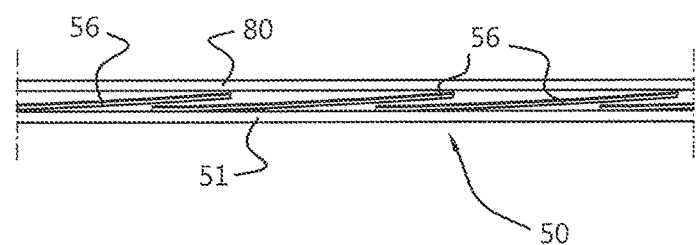
Fig. 6b
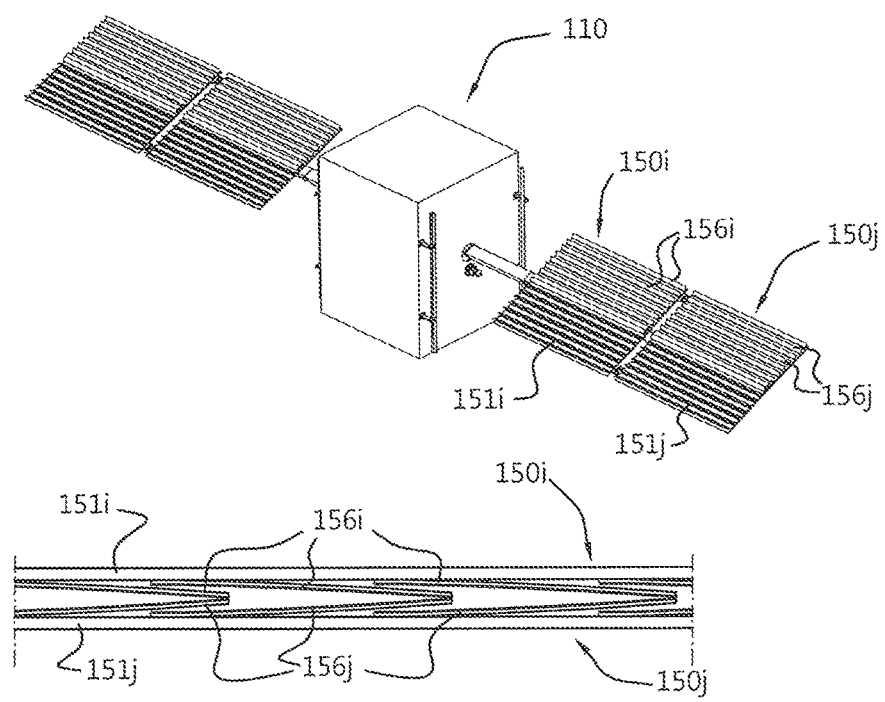

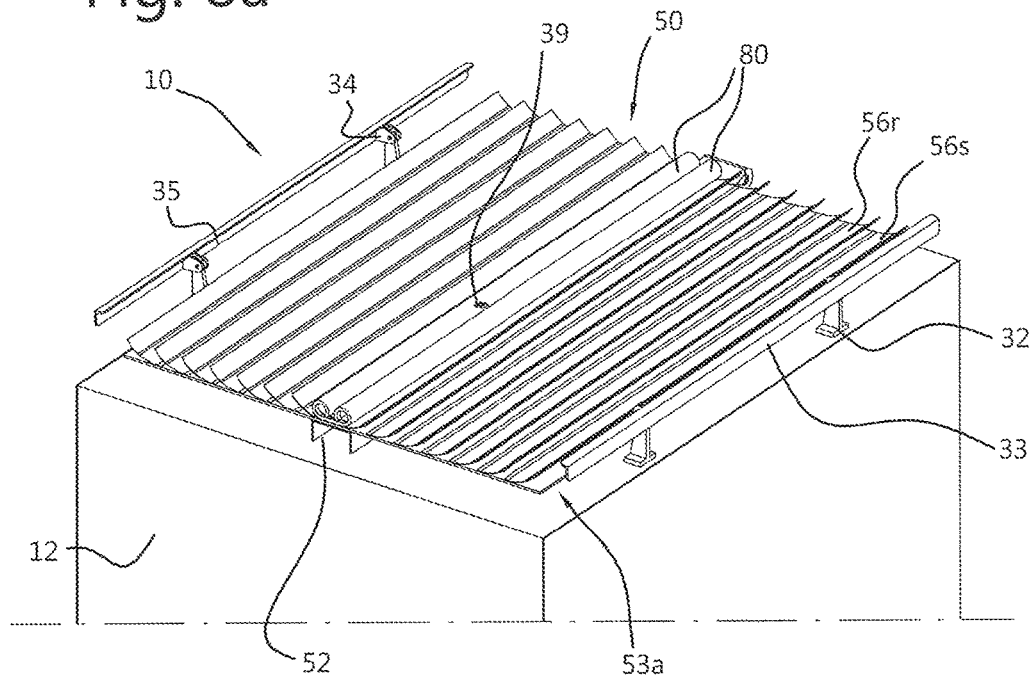
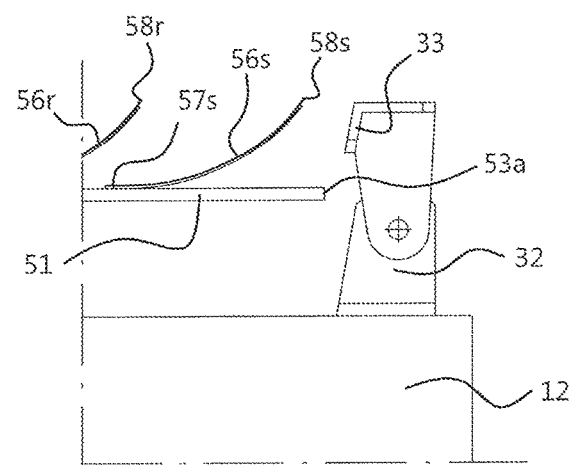

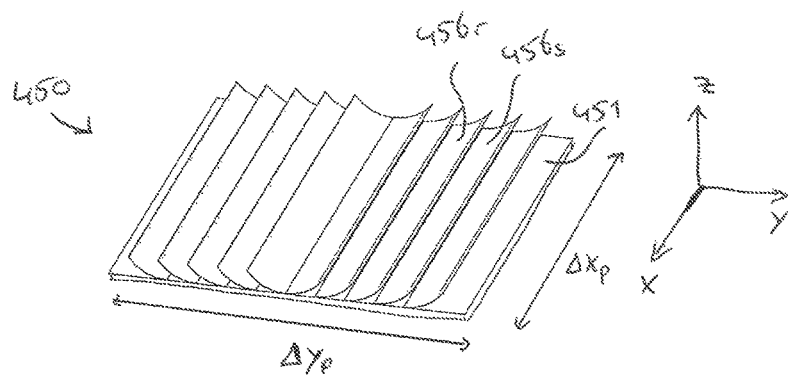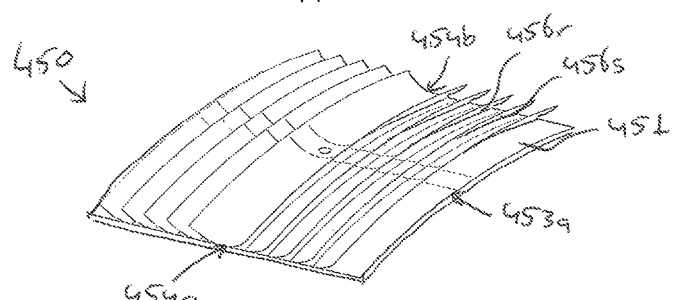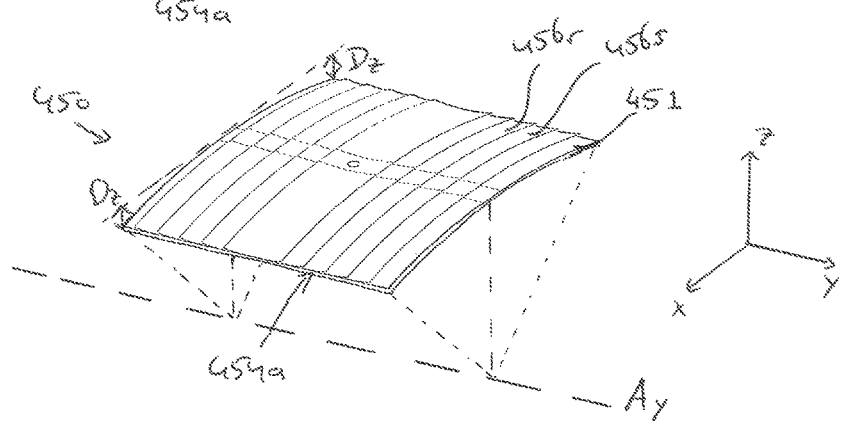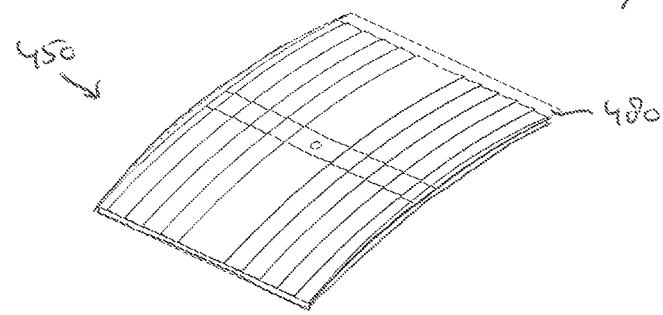

SOLAR PANEL WITH FLEXIBLE OPTICAL ELEMENTS

CROSS REFERENCE TO RELATED APPLICATIONS

This application claims priority from Dutch application number 2015387 filed on 2 Sep. 2015, which is hereby incorporated by reference in its entirety.

TECHNICAL FIELD

The invention relates to a solar array for a spacecraft, and to a spacecraft provided with such a type of solar array.

BACKGROUND ART

Solar arrays for use on spacecraft are known. In particular, such solar arrays are used for powering spacecraft based on photovoltaic (PV) conversion of solar radiation. Various solar cell arrangements for converting solar radiation into electricity have been proposed for space applications.

In general, photovoltaic concentrator arrangements may be used to increase the energy output per unit area occupied by the photovoltaic cells. Such a concentrator arrangement is generally designed to receive solar radiation in an effective collection area and to redirect this received radiation towards the photovoltaic cells. As a result, the photovoltaic cells only need to occupy a part of the solar array.

In space applications, the requirements for solar cell quality (e.g. efficiency, robustness, etc.) are typically very high. The cost of the photovoltaic assembly may be about 50%-60% of the total solar array cost, and about 5%-7% of the total system spacecraft cost. A reduction of the required number of solar cells will therefore contribute significantly to an overall system cost reduction. Compact efficient solar cell arrays and concentrator arrangements are therefore preferred in space applications.

Patent document U.S. Pat. No. 5,344,496 (STERN et al.) describes a solar concentrator cell array for use in space applications, including an arrangement of longitudinally extending mirror elements with parabolic cylindrical surfaces, each of which focuses received sunlight onto a photovoltaic element that is located on a backside of an adjacent mirror element. The described mirror elements are incorporated in a rigid box-like structure that is self-supporting.

Depending on the power requirements of the spacecraft, several solar panels may need to be connected in order to obtain a sufficiently powerful solar array. Typically, such panels are mechanically connected in a foldable manner, so as to be folded-up in a stowed state prior to launch, and to be able to unfold into a deployed state after the launched spacecraft has assumed its intended trajectory in space (e.g. a planetary orbit). U.S. Pat. No. 5,344,496, however, does not disclose methods for coupling multiple solar panels, nor does it disclose mechanisms for stowing or deploying the described concentrator cell array.

It would be desirable to provide a solar array for space applications which not only provides a high energy output per unit of PV cell occupation area, but which also complies with various geometrical and mechanical requirements for the stowed state as well as the deployed state of the spacecraft.

SUMMARY OF INVENTION

Therefore, according to a first aspect, there is provided a solar array for a spacecraft, comprising a solar concentrator that is provided with photovoltaic cells and reflective areas configured for reflecting solar radiation towards the photovoltaic cells. The reflective areas and the photovoltaic cells are provided on opposite surfaces of concentrator reflector sheet members, which are repositionable from a retracted state wherein the concentrator reflector sheet members are in a substantially flat arrangement, to an extended state wherein the concentrator reflector sheet members are raised to allow the reflective areas to reflect solar radiation towards the exposed photovoltaic cells.

The proposed array with repositionable concentrator reflector sheet members forms a selectively deployable solar concentrator, with reflective areas and PV cells provided on opposite surfaces of repositionable concentrator reflector sheet members. In the retracted state of the array, the concentrator reflector sheet members form a flattened arrangement with a reduced height. This yields a reduced stowage volume and greater mechanical robustness in the launch phase of the spacecraft (in stowed state). After launch of the spacecraft, the concentrator reflector sheet members of the array may be repositioned into the extended state, wherein the reflective areas on the front surfaces of the concentrator reflector sheet members form an efficient concentrator arrangement that is configured to receive solar radiation and to redirect this radiation towards the photovoltaic elements provided on the rear surfaces of the concentrator reflector sheet members. This concentration allows a reduction of the number of PV-cells, hence provides also a cost reduction. The proposed solar array arrangement is efficient and adaptable to various deployment conditions.

According to an embodiment, the solar array comprises a support member. The concentrator reflector sheet members may be coupled to the support member and be flexible to allow bending away from the support member to assume the extended state.

The support member serves to define the macroscopic geometry of the solar array, while the flexible concentrator reflector sheet members from a relatively simple transitioning mechanism that does not require complex joints.

For solar arrays in spacecraft applications, acceptable dynamic performance in the stowed state and sufficient structural rigidity in the deployed state are important requirements. In traditional rigid solar panels (e.g. honeycomb CFRP panels with adequate thickness), these properties may be obtained by the inherent structural stiffness of the panel. The stowage volume of such rigid panels may, however, be considerable. In alternative configurations, a thin rollable solar panel may be used to reduce stowage volume in the stowed state. This typically requires the support panel to unroll and extend into a curved meta-stable shape that (temporarily) confers some structural rigidity to the deployed panel. To enable rolling up into the stowed state, the panel must be locally flattened, so that the rigid meta-stable shape can no longer be maintained. This type of solar array requires a support mechanism (e.g. a drum and casing) to confer the rolled up solar panel sufficient stiffness to endure significant stress conditions during launch. In addition, the application of elongated flexible concentrator reflector sheet members on such a rollable panel may be problematic; the linear symmetry of the flexible concentrator reflector sheet members in the extended state either counteracts the curved meta-stable shape of the deployed panel, or requires special measures for fixing the sheet members to the support member only at specific locations along the support panel.

Therefore, according to a further embodiment, the support member forms a support panel with a mounting surface onto which the concentrator reflector sheet members are attached. Here, the support panel is at least partially flexible to allow the support panel to be held in a planar shape with the concentrator reflector sheet members in the extended state, and to allow the support panel to be temporarily bent into a curved shape with the concentrator reflector sheet members in the retracted state, in order to provide geometrical stiffness and a higher resonance frequency for the support panel in a stowed state of the solar array.

The flexible support panel can thus be temporarily retained in a curved shape, and allows the solar array to be kept restrained against a corresponding lateral wall of the spacecraft body in the stowed state, while the concentrator reflector sheet members are retained in their retracted states. The flexible solar panel is elastically deformable i.e. temporarily bendable by external force (thus inducing mechanical stresses), but able to (reversibly) form back to its equilibrium shape after release of the external stress due to internal restoring forces. The support panel and concentrator reflector sheet members may jointly be retained in a macroscopically bent (e.g. curved) manner, to temporarily increase the stiffness of the solar array in the stowed state. This increased stiffness yields a higher resonance frequency (for instance above 30-50 Hz) than in the case of a flat panel stack. By such initial bending of the solar array in the stowed state, the resonance frequency of the array may be shifted upwards away from the characteristic vibration behavior of the launch vehicle during launch. Depending on the mechanical characteristics of the support panel, the lowest eigenfrequency of the curved panel may for example be increased with a factor of 5-10 with respect to the lowest eigenfrequency of the flat panel in equilibrium. By temporarily shifting the frequency response of the panel in the stowed state, the dynamic coupling between the solar array and spacecraft body can be eliminated. Such decoupling reduces the probability of inducing harmful mechanical resonances (for the solar array or the spacecraft), thus yielding a better dynamic performance for the solar array in the stowed state. The panels may for example be made of materials such as aluminum metal sheet, glass fiber or carbon fiber reinforced plastic.

According to an embodiment, the solar array comprises a protection cover foil, which is adapted to cover the concentrator reflector sheet members in the retracted state, and to prevent the concentrator reflector sheet members from repositioning into the extended state.

A protection cover foil provides a simple disposable mechanism for retaining the concentrator reflector sheet members in the retracted state. The cover foil may be applied in the single panel configurations as well as in the multiple panel configurations.

According to an embodiment, the concentrator reflector sheet members comprise a first concentrator reflector sheet member and a second concentrator reflector sheet member. The first sheet member defines a first front surface and a first rear surface, wherein a reflective area is provided at the first front surface. The second sheet member defines a second front surface and a second rear surface, wherein a photovoltaic cell is provided at the second rear surface. In this embodiment, when the concentrator reflector sheet members are in the retracted state, the first and second concentrator reflector sheet members are in a mutually overlapping arrangement with the second rear surface covering at least part of the first front surface. In the extended state, the first and second concentrator reflector sheet members are raised to expose the photovoltaic cell on the second concentrator reflector sheet member and to allow the reflective area to reflect solar radiation towards the exposed photovoltaic cell.

The overlapping arrangement of the concentrator reflector sheet members allows flattening of the arrangement to a reduced height in the retracted state of the array, while providing a considerable effective concentrator surface in the extended state. Although a minimal number of two repositionable concentrator reflector sheet members may be provided in the array, the proposed arrangement may be scaled up to include a larger number of repositionable concentrator reflector sheet members. For example, the concentrator reflector sheet members may be arranged in a linear array of 10-100 bands of concentrator reflector sheet members. Also, the overlapping can be optimized and reduced preventing unwanted contact or chafing.

According to a further embodiment, the concentrator reflector sheet members are formed as elongated rectangular strips, each comprising a first alongside edge that is mechanically coupled to the support member, and a second alongside edge opposite to the first alongside edge, which is suspended freely and bendable away from the support member to allow repositioning from the retracted state to the extended state.

Such elongated rectangular concentrator reflector sheet members are relatively easy to manufacture and fixed mechanically and coupled thermally to the support member in a robust and reproducible manner.

According to an embodiment, in the extended state, the front surfaces of the concentrator reflector sheet members form reflective parabolic cylindrical areas for receiving solar radiation. In this embodiment, the photovoltaic cells are arranged on the rear surfaces of the concentrator reflector sheet members at locations at or near focal areas of the reflective parabolic cylindrical areas on the adjacent concentrator reflector sheet members. In a further embodiment, in the extended state, the photovoltaic cells on the concentrator reflector sheet members are located with an offset towards the reflective parabolic cylindrical area of the adjacent concentrator reflector sheet members, such that the focal areas of the adjacent concentrator reflector sheet members lie beyond the photovoltaic cells. In this particular context, the terms "near" and "offset" relate to distances comparable to a width of the photovoltaic cell(s).

The configuration with reflective parabolic cylindrical areas and PV cells located in the corresponding focal lines provide an efficient solar concentrator arrangement, which allows a significant reduction of PV cell area.

According to an embodiment, the concentrator reflector sheet members are provided with memory metal members configured for repositioning the concentrator reflector sheet members from the retracted state to the extended state.

The memory metal members provide a simple mechanism for transitioning the concentrator reflector sheet members from the retracted state to the extended state. The memory metal members are preferably arranged at the rear surfaces of the concentrator reflector sheet members, to obtain an unobstructed parabolic reflective surface. In addition, these members may act as a mechanical snubber in the stowed configuration for the protection and dynamic behavior control.

According to yet a further embodiment, the support panel comprises a reinforcement member on a side opposite to the mounting surface, wherein the reinforcement member is adapted for mechanically connecting the solar array to a body of the spacecraft.

Preferably, the reinforcement member is formed as a beam with linear symmetry, and provided along a centerline of the support panel. More preferably, the support panel has a shape that is (predominantly) symmetric about this centerline, to form a balanced i.e. stable panel arrangement in the stowed state.

According to a second aspect, and in accordance with the advantages and effects described herein above, there is provided a spacecraft comprising a body, a solar array, and an arm, which articulately couples the solar array to the body. This solar array is provided with concentrator reflector sheet members configured for repositioning from a retracted state into an extended state, in accordance with the first aspect. The solar array is configured to be transitioned from a stowed state wherein the concentrator reflector sheet members are in the retracted state, to a deployed state wherein the concentrator reflector sheet members are in the extended state.

According to an embodiment, the spacecraft comprises a hold-down mechanism for affixing the solar array to the spacecraft body in the stowed state.

According to a further embodiment, the solar array comprises an at least partially flexible support panel, wherein the hold-down mechanism comprises retaining members configured for fixing the solar array with respect to the spacecraft body in the stowed state, with the support panel retained in a curved panel shape. Advantages of initial bending of the solar array in the stowed state, to adapt resonance frequency behavior during the launch phase of the spacecraft, have already been discussed herein above. Preferably, the solar array in the stowed state is retained with its support panel predominantly along the body of the spacecraft. According to a further embodiment, the support panel may have a characteristic size in a direction along a plane of the panel, wherein the support panel is retained in the curved shape in the stowed state with a maximum deflection away from a planar shape in the deployed state. Here, a ratio R of the maximum deflection to the characteristic size may comply with $0<R\leq 1/5$, and preferably with $0<R\leq 1/10$. This ratio R implies that the maximum deflection of the temporarily curved shape of the support panel in the stowed state with respect to the planar equilibrium shape may be at most 20%, or preferably at most 10%, of the characteristic in-plane size of the support panel. This means that the panel bending effect is preferably kept relatively small, so that the induced bending stress on the support panel is kept limited.

According to a further embodiment, the (stowed) support panel is retained in the curved shape around a longitudinal axis of curvature, with concentrator reflector sheet members forming elongated rectangular strips that extend substantially parallel with this axis of curvature.

According to an alternative further embodiment, the (stowed) support panel is retained in the curved shape around a transversal axis of curvature, with concentrator reflector sheet members forming elongated rectangular strips that extend substantially perpendicular to this axis of curvature.

By bending the support panel about a transversal axis of curvature that is perpendicular to the elongation direction of the concentrator reflector sheet members, the latter will be forced to transition from their extended states to their retracted states due to anti-clastic bending energy. This anti-clastic effect helps to keep the concentrator reflector sheet members flattened against the mounting surface of the support panel in the stowed state of the solar array, thus obviating the need to apply further external forces (e.g. by means of a cover foil) to prevent the concentrator reflector sheet members from repositioning into their extended states.

Preferably, the retaining members are configured to press down lateral edges of the support panel towards the spacecraft body in the stowed state, in order to retain the support panel in the curved panel shape.

According to a further embodiment, the solar array comprises a protection cover foil in the stowed state of the solar array, which is pre-tensioned for inducing self-removal to allow the concentrator reflector sheet members to reposition into the extended state, and wherein the retaining members are configured for keeping the protection cover foil pressed onto the concentrator reflector sheet members in the retracted state. The concentrator reflector sheet members may for example be reposition by means of elastic energy, or by active means e.g. memory metal strips or equivalent.

According to an embodiment, the hold-down mechanism comprises tensioning cabling for preventing the hold-down mechanism from releasing the solar array from the spacecraft body in the stowed state, and a thermal knife for cutting the tensioning cabling and releasing the hold-down mechanism to let the solar array assume the deployed state.

In an embodiment, the hold-down mechanism comprises only one hold-down and locking point for affixing the solar array to the spacecraft body.

In embodiments, the solar array comprises a reinforcement member, which is provided with an aperture, which preferably forms a through hole extending through the reinforcement member. Here, the hold-down mechanism may be adapted to extend through the aperture to restrict both in-plane and out-of-plane motion of the support member with respect to the spacecraft body when the solar array is in the stowed state.

As there are few options for correcting a failing release mechanism in space, the number of release mechanisms is preferably minimal. The proposed reinforcement member with aperture allows only one active hold-down point to be employed. This hold-down point is preferably near the center of the panel. Preferably, both the support panel and reinforcement member have apertures that are coinciding, so that the hold-down mechanism may extend through both apertures simultaneously.

A spacecraft with a solar array comprising a flexible support panel, which in the stowed state is retained in a bent shape and kept fixed with respect to the spacecraft body, may be implemented as an improvement in and of its own, and its various embodiments may be subject of a divisional application. Hence, a further aspect and embodiments thereof are defined by the set of clauses presented herein below, which may be subject of another application.

BRIEF DESCRIPTION OF DRAWINGS

Embodiments will now be described, by way of example only, with reference to the accompanying schematic drawings in which corresponding reference symbols indicate corresponding parts, and in which:

FIGS. 5a and 5b present perspective views of an embodiment of a spacecraft in a stowed state;

FIGS. 6a and 6b present cross-sectional side views of two alternative solar array embodiments;

FIGS. 8a-8b show details of a solar array embodiment, with sheet members in an extended state;

FIGS. 13a-13d show an alternative bending mode of a solar array according to another embodiment.

The figures are meant for illustrative purposes only, and do not serve as restriction of the scope or the protection as laid down by the claims.

DESCRIPTION OF EMBODIMENTS

The following is a description of certain embodiments of the invention, given by way of example only and with reference to the figures.

It should be understood that the directional definitions and preferred orientations presented herein merely serve to elucidate geometrical relations for specific embodiments. The concepts of the invention discussed herein are not limited to these directional definitions and preferred orientations. Similarly, directional terms in the specification and claims, such as "front", "back/rear", "top," "bottom," "left," "right," "up," "down," "upper," "lower," "proximal," "distal" and the like, are used herein solely to indicate relative directions and are not otherwise intended to limit the scope of the invention or claims.

Figure 1:
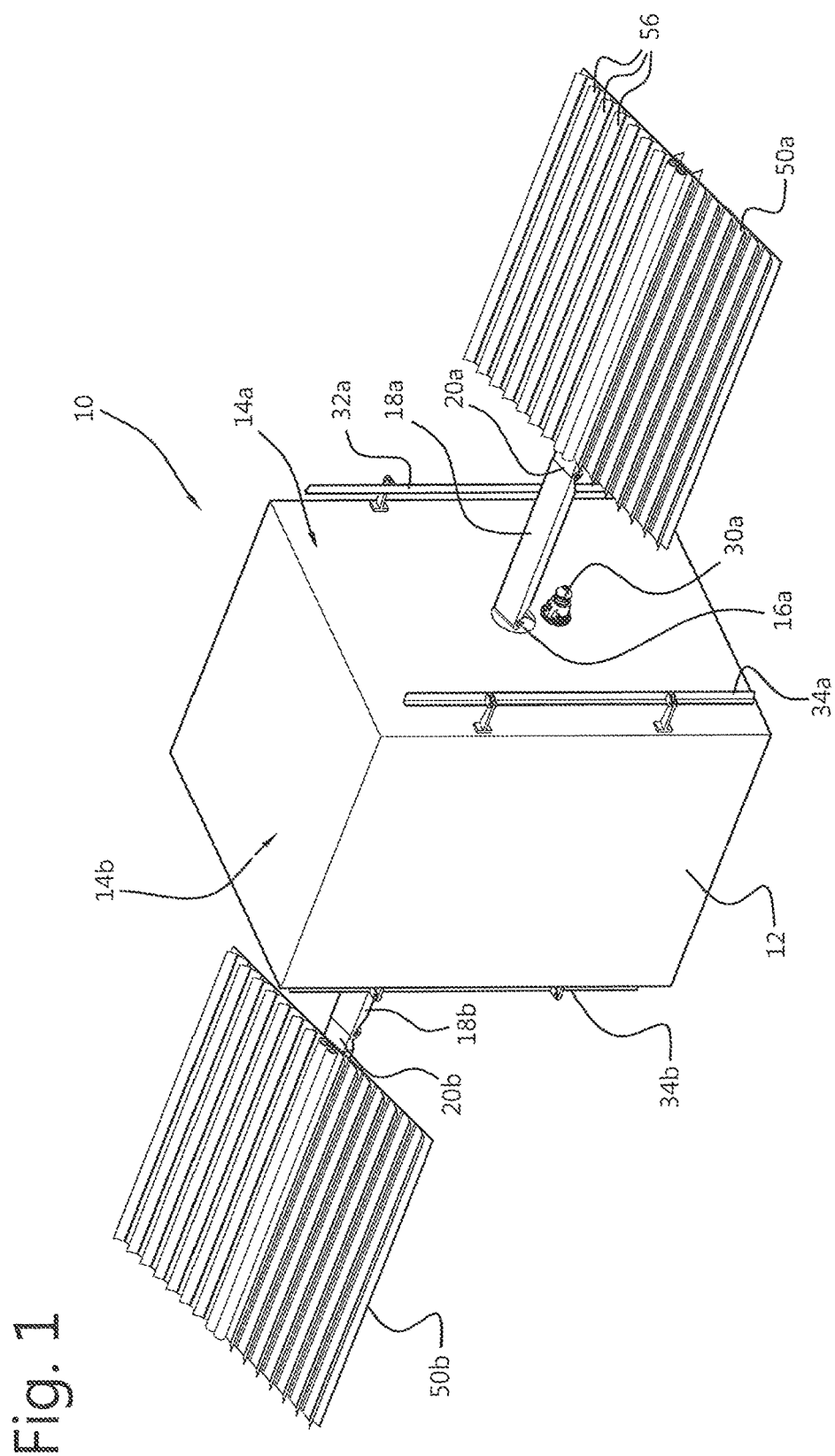
FIG. 1 schematically shows a perspective view of an embodiment of a spacecraft (e.g. satellite) according to an embodiment.

FIG. 1 schematically shows a perspective view of an embodiment of a spacecraft 10 according to an embodiment. In this example, the spacecraft is formed as a satellite unit 10. The satellite unit 10 includes a body 12 and a solar array formed by two solar array subsystems 50a, 50b, which in this example are each formed as a solar panel. (The entire array and array subsystems or panels will be generically indicated by reference number 50 whenever the distinction is immaterial). In FIG. 1, the solar panels 50 are shown in a fully deployed state, wherein solar radiation may be received and converted into electricity.

In FIG. 1, satellite body 12 has been schematically depicted as a box with multiple faces. The satellite unit 10 comprises an electrical power system (not indicated in FIG. 1) in or on the satellite body 12, which is adapted to receive electric power generated by the solar array subsystems 50.

In this example, the two solar array subsystems 50a, 50b are mechanically coupled to two opposite lateral faces 14a, 14b of the satellite body 12. Each solar panel 50 is coupled to the satellite body 12 via a joint 16, an arm 18, and a further joint 20.

The arm 18 may be made for instance of light weight carbon fiber reinforced plastic (CFRP) or equivalent. The arm 18 with joints 16, 20 serves as a primary deployment boom for positioning the solar panel 50 at an appropriate distance from the satellite body 12, to reduce unwanted shadowing by the satellite body 12 onto the solar panel 50.

The joint 16 is adapted for adjusting the facing direction of the solar panel 50 in the deployed state, e.g. via hinging and/or rotating motion. The further joint 20 defines a hinged connection to provide an additional degree of freedom for canting the solar panel 50. Both the joint 16 and the further joint 20 comprise actuation mechanisms (not shown) that are remotely operable, so that the associated solar panel 50 may be moved relative to the satellite body 12 and track the direction of the sun. These joints 16, 20 may function based on controllably reversible actuator mechanisms (e.g. actively driven motors), and/or passive irreversible actuators (e.g. spring driven mechanisms). A "carpenter rule" type hinge may also be employed, which is sufficiently biased in advance to deploy the solar panels.

The satellite unit 10 may comprise a sensor and processor arrangement (not shown) that is configured for tracking the position of the sun relative to the satellite body 12, and for repositioning the solar panels 50 with respect to the satellite body 12 so that radiation from the sun will impinge onto the panel surfaces in an essentially perpendicular direction.

The satellite unit 10 in FIG. 1 further comprises hold down mechanisms 30, 32, 34. Each hold-down mechanism 30-34 is provided on a lateral surface 14 of the satellite body 12, and adapted to fix an associated solar panel 50 to the satellite body 12 when the solar panel 50 is in the stowed state. The hold-down mechanism 30-34 comprises a locking member 30, lateral retaining members 32, 34 and tensioning cabling 36 (not depicted). Hold-down mechanism embodiments are discussed in more detail below with reference to FIGS. 5a-5b, 7a-7b, 8a-8b, and 9a-9b.

Figure 2:
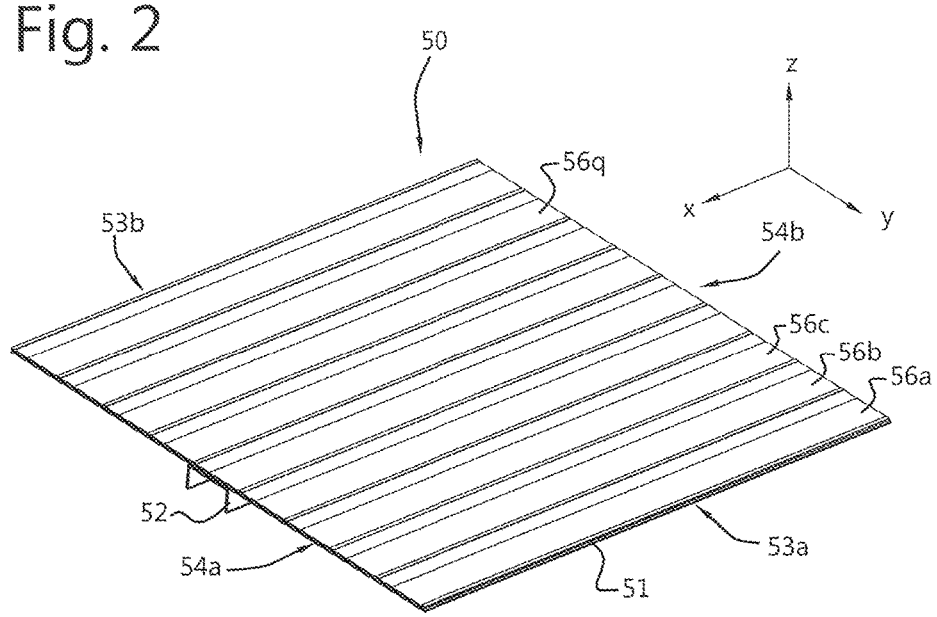
FIG. 2 shows a perspective view of an embodiment of a solar array panel, with concentrator reflector sheet members in a retracted state.

FIG. 2 depicts an embodiment of a solar panel 50. The solar panel 50 comprises a support member 51 and an array of parallel rows of concentrator reflector sheet members 56a . . . 56q (jointly indicated by 56). In this example, the support member 51 is formed as a support panel 51. Here, the support panel 51 has a predominantly rectangular shape with two pairs of opposite lateral edges 53a, 53b and 54a, 54b.

The support panel 51 comprises for instance a honeycomb core structure with a front face-sheet defining the front panel surface and a back face-sheet defining a rear panel surface. Such honeycomb-type panels may be formed according to methods known in the art. The support panel 51 may be relatively thin. The two face sheets may for example be made of carbon fiber reinforced plastic (CFRP), glass fiber reinforced plastic (GFRP), or Aluminum. The panel substrate could also be a monocoque sheet, depending on the required bending flexibility.

FIG. 2 depicts the concentrator reflector sheet element 56 in a retracted state. The concentrator reflector sheet members 56 are formed as predominantly parallel rows of elongated elements mounted on a front surface of the panel 51. The concentrator reflector sheet members 56 are self-deployable so that they can self-extend to their deployed (operational) configuration as soon as restraining forces from an external retaining mechanism are removed. The concentrator reflector sheet members 56 are preferably biased to extend themselves to their operational configuration in the absence of external restraining forces.

The support panel 51 may be provided with a mechanically rigid member 52, to provide structural reinforcement once the solar array has assumed the deployed state. In this example, the reinforcement member is formed as a support beam 52 with an elongated shape that extends on the rear side of the support panel 51 along a centerline thereof, and substantially parallel with lateral panel edges 53a, 53b. Here, the support beam 52 has a rectangular U-shaped cross-section, with legs protruding downward away from the rear side of the support panel 51. This shape provides structural reinforcement, and defines an elongated space for accommodating the deployment boom 16, 18, 20 if folded up e.g. in the stowed state.

Figure 3:
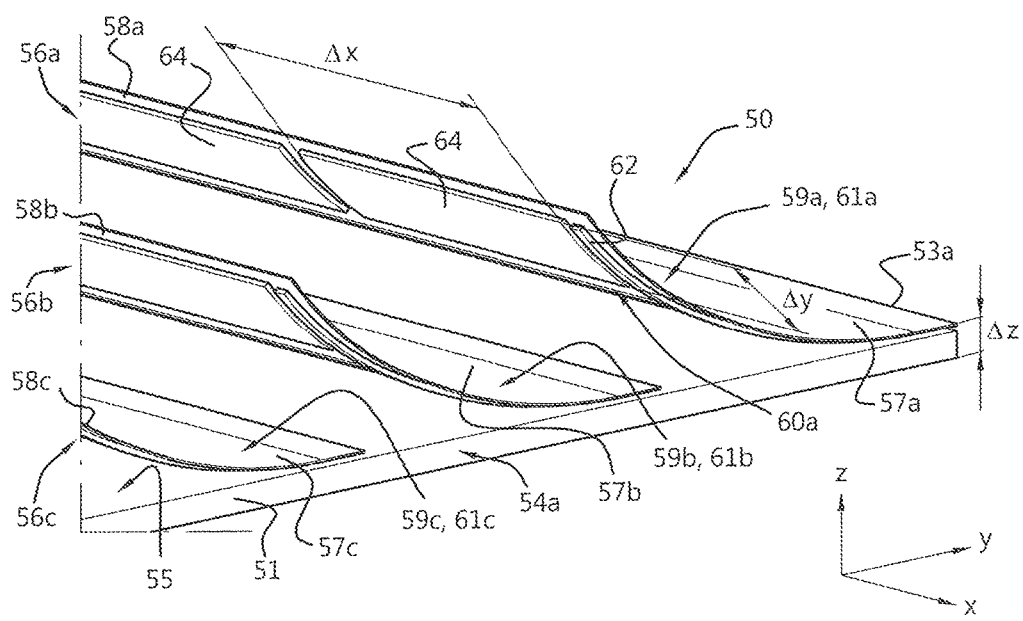
FIG. 3 shows a perspective partial view of an embodiment of a solar array panel, with concentrator reflector sheet members in a extended state.

FIG. 3 shows the array of concentrator reflector sheet members 56 in the extended state. The concentrator reflector sheet members 56 are mounted on a front surface 55 of the support member 51. In this example, the concentrator reflector sheet members 56 are formed as elongated rectangular strips, each comprising a first alongside edge 57 that is directly attached to the support member 51, and a second alongside edge 58 opposite to the first alongside edge 57, which is suspended freely and bendable away from the support member 51 to allow repositioning between the retracted and extended states.

In the extended state, the concentrator reflector sheet members 56 are curvedly shaped to serve as optical concentrators that reflect incident solar radiation towards a rear surface 60 of an adjacent mirror reflector 56.

The front surfaces 59 of the concentrator reflector sheet members 56 in the extended state form an array of off-axis cylindrical parabolic mirrors 61 with a relatively short focal length. For space applications, the material of the concentrator reflector sheet members 56 should be resistant to the harsh environment in space. In addition, the concentrator reflector sheet members 56 are preferably relatively thin, yet sufficiently flexible to allow flexing between the retracted state and the extended state. CFRP sheet may be a suitable material for the concentrator reflector sheet members 56.

An optically reflective coating may be provided on at least part of the front surfaces 59. Preferably, this coating is highly reflective to allow the front surface 59 to act as an efficient mirror 61 for incoming solar radiation. The coating may for example consist essentially of a thin silver coating layer with a protection layer on top (e.g. ATOX/UV degradation protection).

The rear surfaces 60 of the concentrator reflector sheet members 56 define mounting areas for the PV cells 64 and for sheet deployment members 62. In this example, the solar panel 50 is provided with Gallium Arsenide (GaAs) PV cells 64, which as such are known in the art. The PV cells 64 may have a (flat) width $\Delta y$ of about 15-20 millimeters and a length $\Delta x$ of about 80 millimeters. The PV cells 64 are attached onto the concentrator reflector sheet members 56, on the rear surface 60 thereof. Electrical power harness of the PV cells 64 may be routed via the support panel 51 to the arm 18 and subsequently to the joint 16, where the power is collected and distributed to the electrical power system of the spacecraft 10.

The sheet deployment members 62 are configured to cause the associated concentrator reflector sheet members 56 to self-deploy to their extended state when external conditions are changed (e.g. external forces are removed, temperature is changed, etc.). Such deployment members 62 may for example comprise memory metal (bi-metal) biasing strips. The deployment members 62 may additionally comprise longitudinal connecting members (e.g. stringers) at regularly spaced locations in between the PV cells 64, to assist in the repositioning of the concentrator reflector sheet members 56 from the retracted state to the extended state. This allows the concentrator reflector sheet members 56 to assume the intended geometric shape to form reflective parabolic cylinder surfaces 61. The solar panel 50 may be stowed for an extended period prior to launch and subsequent deployment of the solar panel 50. The deployment members 62 are preferably capable of being stowed in a collapsed state for an extended period of time, yet retain their biasing ability so that, in the absence of external forces, the deployment members 62 force the concentrator reflector sheet members 56 into their extended operational configuration.

Figure 4A:
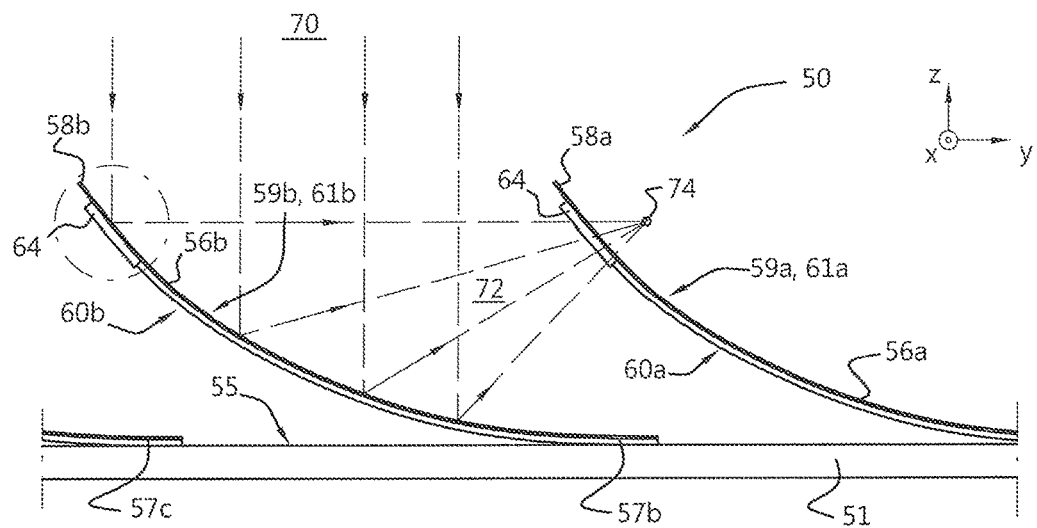
FIGS. 4a and 4b show geometrical details of the solar array embodiment from FIG. 3.
Figure 4B:
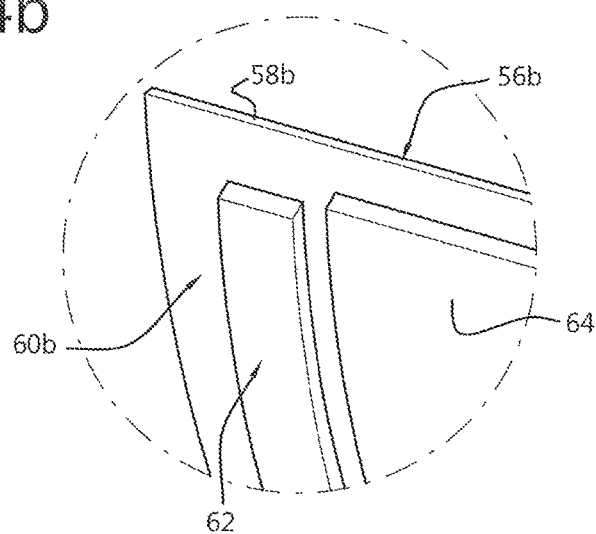

FIG. 4a depicts a cross-sectional view of an array of concentrator reflector sheet members 56, to illustrate the optical concentrator properties thereof. Only three concentrator reflector sheet members 56a-56c are shown for clarity. It should be understood that any convenient number of concentrator reflector sheet members 56 may be used in an array, depending on the required electricity yield and the available area.

As explained above, the deployable concentrator reflector sheet members 56 are formed in this example as parabolic reflectors. Each concentrator reflector sheet member 56 defines a reflective off-axis parabolic cylinder area 61 on its front surface 59, and a PV cell 64 on its rear surface 60.

The cross-sectional side view in FIG. 4a depicts the off-axis parabolic profile of the front surfaces 59. Optical radiation trajectories or rays are indicated by dashed lines 70, 72. At the small scale of the spacecraft 10, incoming light rays 70 from the sun may be considered to travel in essentially parallel trajectories, allowing a plane wave approximation for the radiation. By proper positioning of the solar panels 50, the incoming light rays 70 may be caused to impinge on the solar panels 50 in an essentially perpendicular direction. (In this context, the term "essentially perpendicular" may relate to an acceptable angular offset of less than 1° from the panel surface normal.)

The incoming light rays 70 reflect off the front surface 59 of the concentrator reflector sheet member 56b and are reflected along reflected light rays 72 towards the focal region 74. Due to the parabolic shape of the front surfaces 59, the incoming light rays 70 that impinge on distinct parts of the front surface 59b will be concentrated towards the same focal region 74. In the two-dimensional representation of the exemplary sheet members in FIG. 4a, the focal region 74 is depicted as a point. From the three-dimensional representation of FIG. 3, however, it should be clear that the focal regions 74 in this exemplary embodiment correspond with focal lines. As is illustrated in FIG. 4a, an adjacent concentrator reflector sheet member 56a (in the extended state) may be positioned with its PV cell 64 substantially parallel with the focal region 74 of the reflective parabolic cylindrical surface 59b. The adjacent sheet member 56a is positioned with an offset towards the sheet member 56b, such that the focal region 74 of the concentrator reflector sheet member 56a will be located behind the PV cell 64. Reflected solar radiation 72 will thus be directed towards the PV cell 64 on the adjacent concentrator reflector sheet member 56a for conversion into electrical energy, but distributed over the flat width $\Delta y$ of the PV cell 64 to maximize radiation collection while avoiding excess radiation heating.

The arrangement of concentrator reflector sheet members 56 in the extended state reduces the necessary PV cell occupation area by a factor that inversely relates to a concentration ratio (CR) between the effective frontal solar radiation exposure area on the one hand and the effective collection area of the PV cells 64 on the other hand. A significant CR may be achieved by the proposed arrangement (e.g. up to 3 or even 4), hence leading to a considerable reduction in the required PV cells 64 and corresponding costs.

The exemplary arrangement of concentrator reflector sheet members 56 in the extended state may block a significant portion of the incoming particle radiation and UV radiation from the front (e.g. oblique radiation contributions). As a result, the PV cells 64 no longer require cover glass, which yields a reduction in cost and mass.

FIGS. 5a and 5b presents perspective views of an embodiment of the spacecraft 10 in the stowed state.

FIG. 5a illustrates an embodiment wherein the solar array panel 50 is sufficiently flexible to allow it to be retained in a curved shape when the solar array 50 (or spacecraft 10) is in the stowed state.

In the stowed state, the solar array panels 50 are kept restrained against the corresponding lateral walls 14 of the satellite body 12. In this stowed state, the solar panel 50 is held in a curved shape, to temporarily increase the mechanical stiffness performance of the stowed panel by introducing geometrical stiffness, thereby yielding a higher stowed resonance frequency.

It should be recognized that a stowed state of the spacecraft 10, e.g. the state shown in FIG. 5a, generally precedes the deployed state of the spacecraft, e.g. the state shown in FIG. 1. Generally, a spacecraft 10 will not transition from a deployed state back into the stowed state while traversing its intended trajectory through space (e.g. a planetary orbit), unless recovery of the spacecraft 10 is required.

The solar arrays 50 are kept in their stowed state by means of hold-down mechanisms 30-36. In this embodiment, each hold-down mechanism 30-36 comprises only one hold-down and locking point for affixing the corresponding solar array panel 50 to the satellite body 12. The hold-down mechanisms 30-36 are provided on lateral surfaces 14 of the satellite body 12, and each includes a locking member 30, lateral retaining members 32, 34, and tensioning cabling 36. Once the cable 36 at the hold-down point 30 is released, the lateral retaining members 32, 34 are released as well.

In the stowed state, the arm 18 is folded underneath the curved support panel 51 and is accommodated inside the reinforcement structure 52, which in this example forms a rectangular U-shaped beam 52.

In the retracted state, the concentrator reflector sheet members 56 are kept restrained onto the upper surface 55 of the support panel 51, thereby temporarily forcing the biasing members 62 towards the support panel 51. Mechanisms for restraining the concentrator reflector sheet members 56 are discussed below with reference to FIGS. 6a-8b.

FIG. 5b shows an exemplary hold-down mechanism 30, 32, 34, 36 in more detail. In particular, FIG. 5b illustrates tensioning cabling 36 that is spanned across the lateral satellite body surface 14 in a trajectory that interconnects the locking mechanism 30 and the retaining members 32, 34, so as to change the position of (i.e. release) the retaining members 32, 34 in response to actuation by the locking member 30. In this example, the release cable 36 circumferences the solar panel 50 and is coupled to a cable biasing member (e.g. helical spring 37) to ensure sufficient preload of the cable 36.

FIGS. 6a and 6b present cross-sectional side views of two alternative solar array embodiments.

FIG. 6a depicts an embodiment of a solar array 50 with concentrator arrangement similar to FIGS. 2-4b. Similar elements are indicated with similar reference numbers, and will not be discussed here again.

In this embodiment, the solar array 50 comprises the protection cover foil 80, which is arranged on the same mounting surface 55 of the support panel 51 as the concentrator reflector sheet members 56. The protection cover foil 80 is arranged directly on top of the concentrator reflector sheet members 56, to cover the concentrator reflector sheet members 56 in the retracted state and to prevent them from prematurely transitioning into the extended state. The protection cover foil 80 may for example comprise a lightweight polyimide film. The protection cover foil 80 is described in more detail with reference to FIGS. 7a-8b.

FIG. 6b depicts an alternative embodiment of a solar array 150 with concentrator arrangement. Features in this embodiment that have already been described above with reference to FIGS. 2-6a may also be present in the solar array 150 shown in FIG. 6b, and will not all be discussed here again. Like features are designated with similar reference numerals preceded by 100, to distinguish the embodiments.

In this embodiment, selected ones or all solar arrays 150 of the spacecraft may comprise a plurality of support panels 151i, 151j, configured to be foldable for stowage, with their front panel surfaces 155i, 155j facing each other. All concentrator reflector sheet members 156i, 156j may be in retracted states when the solar array 150 is folded up for stowage. In the embodiment shown in FIG. 6b, the concentrator reflector sheet members 156i on the first panel 151i are flattened as a result of an abutting engagement with reflector elements 156j on the second panel 151j (and vice versa), when the panels 151i, 151j are folded up. Due to the abutting engagement of the concentrator reflector sheet members 156i, 156j, the protection cover foil 80 from the embodiment in FIG. 6a need not be present in the embodiment of FIG. 6b.

FIGS. 7a-8b show more details of the solar array embodiment 50 as discussed above with reference to FIG. 6a.

The support panel 51 of the solar array 50 is at least partially flexible for retaining the support panel 51 in a bent panel shape, when the solar array 50 is in the stowed state.

In the retracted state of the concentrator reflector sheet members 56, the assembly of the support panel 51 and concentrator reflector sheet members 56 may be retained in a curved manner, to increase the stiffness of the solar array 50 in the stowed state. This increased stiffness yields a higher resonance frequency than in the case of a flat panel stack. By such initial bending of the solar array 50 in the stowed state, the resonance frequency of the solar array 50 may be shifted away from the mechanical vibration behavior of the launch vehicle during the launching phase, thus reducing the probability of inducing unwanted mechanical resonances.

The hold-down mechanism 30-36 comprises retaining members 32, 34 configured for fixing the solar array 50 with respect to the satellite body 12 when the solar array 50 is in the stowed state. The retaining members 32, 34 are configured to press down lateral edges 53a, 53b of the support panel 51 towards the satellite body 12 when the solar array is in the stowed state, to keep the support panel 51 in the bent panel shape, thus providing the geometrical stiffness.

Figure 7A:
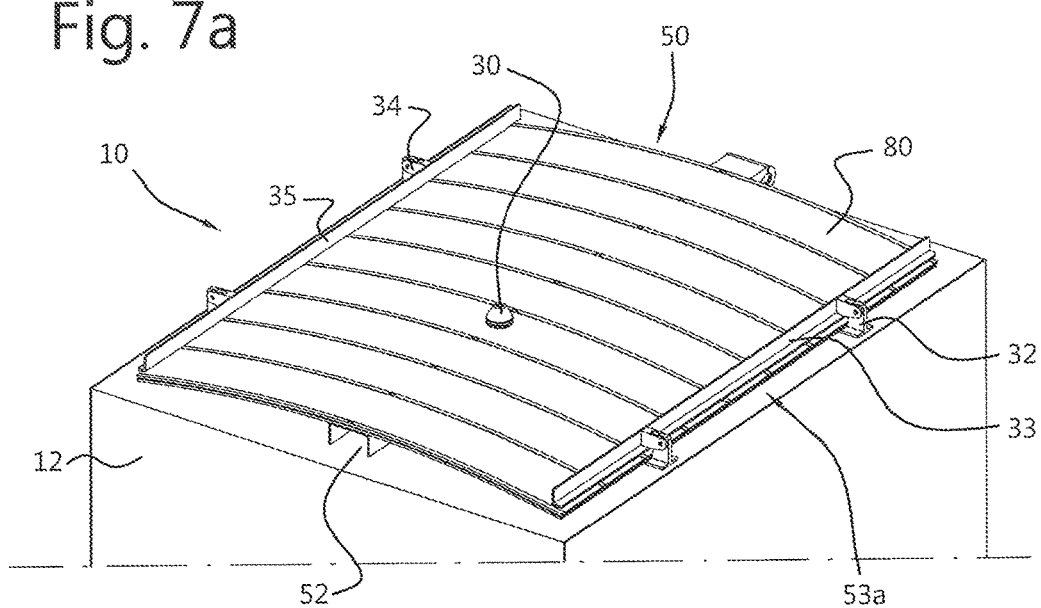
FIGS. 7a-7b show details of a solar array embodiment, with sheet members in a retracted state.
Figure 7B:
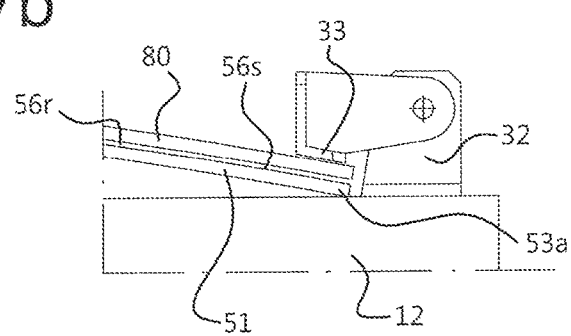

FIGS. 7a and 7b depict the solar array 50 with concentrator reflector sheet members 56 in the retracted states. The protection cover foil 80 is arranged directly on top of the concentrator reflector sheet member 56, to cover the concentrator reflector sheet members 56 in the retracted state, and to prevent the concentrator reflector sheet members 56 from repositioning into the extended state. The protection cover foil 80 may serve as a shielding layer for the solar concentrator and its concentrator reflector sheet members 56 as long as the solar panel 50 remains in the stowed state (e.g. during launch of the spacecraft 10). In this example, the protection cover layer 80 serves to force the sheet deployment members 62 towards the upper surface 55 of the support panel 51 and to keep the concentrator reflector sheet members 56 from bending upwards into their extended states.

In this embodiment, protection cover foil 80 is pretensioned in such a manner that release of the protection cover foil 80 would cause it to roll up about an axis towards a predetermined region, thereby causing the concentrator reflector sheet members 56 to become exposed.

FIGS. 7a-7b show the retaining members 32, 34 of the hold-down mechanism 30-36 in a clamped state. In this example, the retaining members 32, 34 have engagement ledges 33, 35 that are canted to engage and hold down opposite lateral edges 53a, 53b of the solar panel 50. The held-down engagement ledges 33, 35 keep the support panel 51 in a pre-stressed state, which is curved in this embodiment. The ledges 33, 35 of the retaining members 32, 34 also press the pre-tensioned protection cover foil 80 down onto the front panel surface 55 and prevent it from rolling up.

FIGS. 8a and 8b depict the solar array 50 with concentrator reflector sheet members 56 in the extended states. FIGS. 8a-8b show the retaining members 32, 34 after their release. In this example, release of the retaining members 32, 34 involves a rotation of the respective engagement ledges 33, 35 upwards away from the upper panel surface 55. This release of the retaining members 32, 34 causes the support panel 51 to curve back to its equilibrium state, which is flat in this embodiment. The removal of the retaining members 32, 34 also releases the protection cover foil 80, so that the pre-tensioning to the protection cover foil 80 causes the protection cover foil 80 to roll up.

In FIGS. 7a-8b, the protection cover foil 80 has been applied as two separately releasable portions onto the support panel 51 and concentrator reflector sheet members 56, each portion of the protection cover foil 80 corresponding with one half of the support panel 51. In this example, the protection cover foil portions are adapted to automatically roll up towards a centerline of the support panel 51, and assume rolled-up resting positions along the reinforcement beam 52.

Figure 9A:
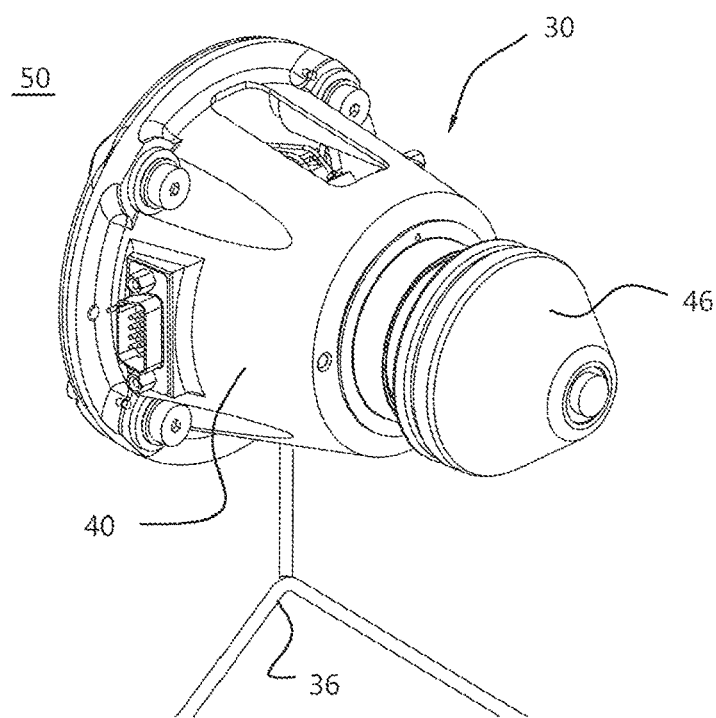
FIGS. 9a and 9b show a hold-down and locking mechanism for a solar array on a spacecraft according to an embodiment.
Figure 9B:
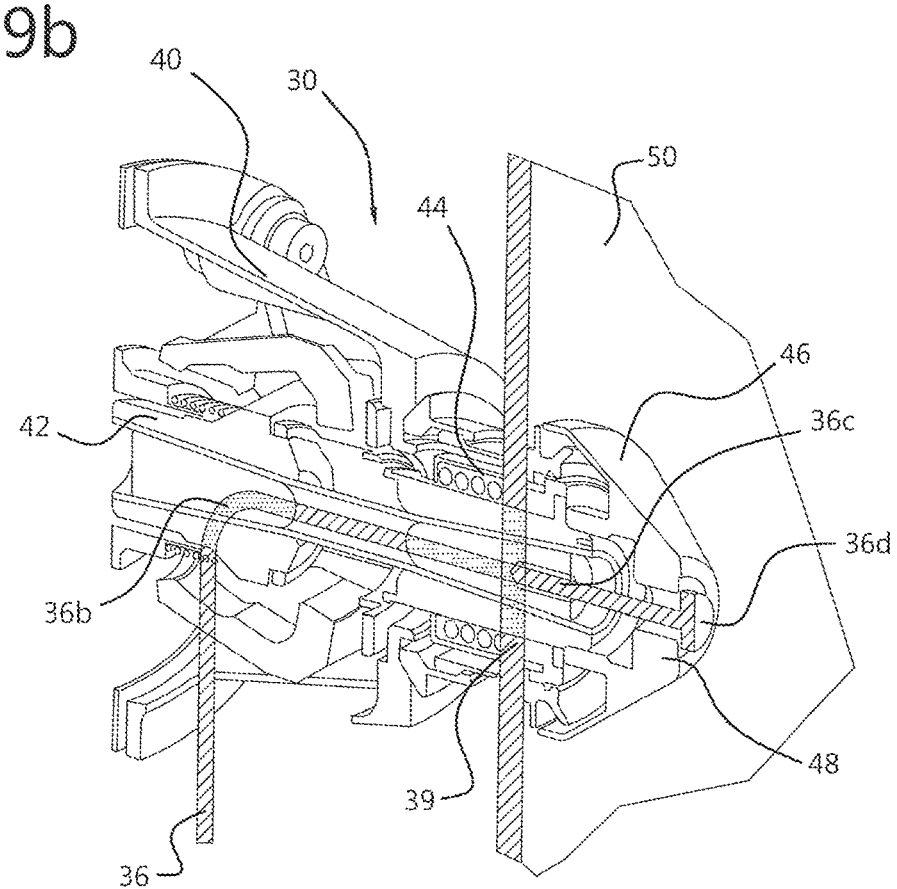

FIGS. 9a and 9b show an exemplary locking member 30 forming part of a hold-down mechanism 30-48 for a solar array 50. The hold-down mechanism 30-48 comprises a central hold down based on a thermal knife actuation principle. The principle is explained in patent document U.S. Pat. No. 4,540,873 (hereby incorporated by reference in its entirety). In alternative embodiments, the locking member may be implemented with a pyro-activated release unit.

The locking member 30 comprises a base 40, a guide member 42, a biasing member 44, a clamping member 46, and a cable aperture 48. The locking member 30 comprises a thermal knife for cutting the tensioning cabling and releasing the hold-down mechanism 30-48 to let the solar array 50 assume the deployed state. The base 40 is directly mounted onto the body 12 of the spacecraft 10. The clamping member 46 is directly and releasably coupled to the base 40, to hold an intermediate flat structure (e.g. solar panel 50) fixed against the base 40. In this example, both the base 40 and the clamping member 46 form rigid frusto-conical structures.

In the stowed state, the solar panel 50 is constrained against the base 40 by the clamping member 46. The solar panel 50 is provided with a central hold-down aperture 59 through which the clamping member 46 extends in the stowed state of the solar panel 50. The solar panel 50 is thus retained by the clamping member 46 in the in-plane (lateral) directions as well as in the out-of-plane (normal) directions.

When the thermal knife of the locking mechanism 30 is activated and heated, the restraint cable 36 is cut in a manner that generates only little or even insignificant mechanical shock or vibration.

Once the locking mechanism 30 has been activated by the thermal knife, the distal end 36d of the cable 36 is cut to release the clamping member 46 from the base 40. Simultaneously, the cutting of the cable 36 causes a pull by the cable biasing members 37, allowing simultaneous release of the retaining members 32, 34. The engagement ledges 33, 35 rotate to release the corresponding edges of the solar panel 50. The mechanical energy stored in the bent solar panel 50 is swiftly released, and the panels flexes back into its flat equilibrium shape. Once the solar panels 50 has straightened, the concentrator reflector sheet members 56 of the concentrator arrangement raise (actively or passively) into the extended state to form the parabolic trough reflectors arrangement.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. It will be apparent to the person skilled in the art that alternative and equivalent embodiments of the invention can be conceived and reduced to practice. All changes which come within the meaning and range of equivalency of the claims are to be embraced within their scope.

For example, the spacecraft may include a single solar array or multiple solar arrays. The number of solar arrays carried by the spacecraft will depend on the power required by the spacecraft, and each solar array may have any number of solar panels.

Figure 10A:
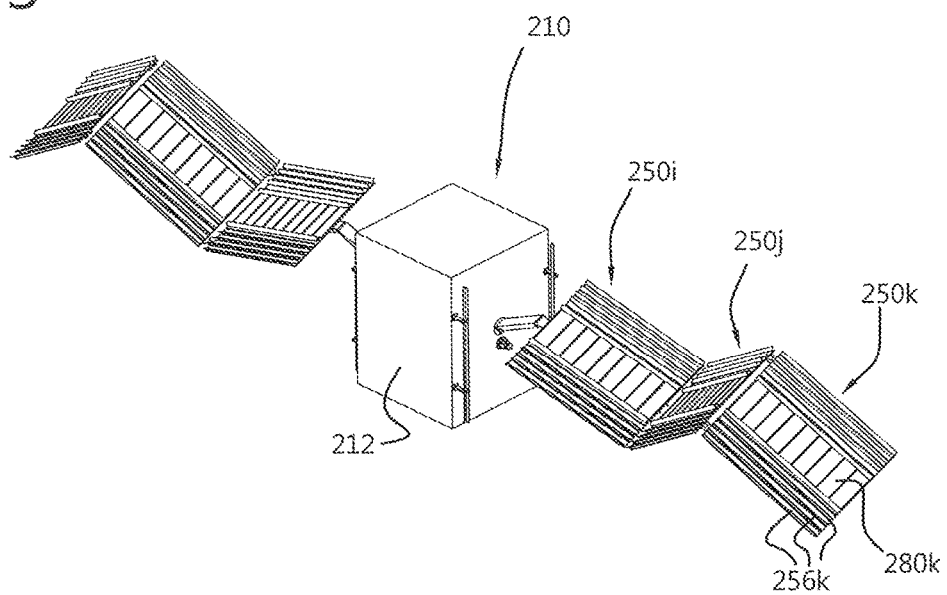
FIGS. 10a-11b show other spacecraft embodiments with various solar panel arrangements.
Figure 10B:
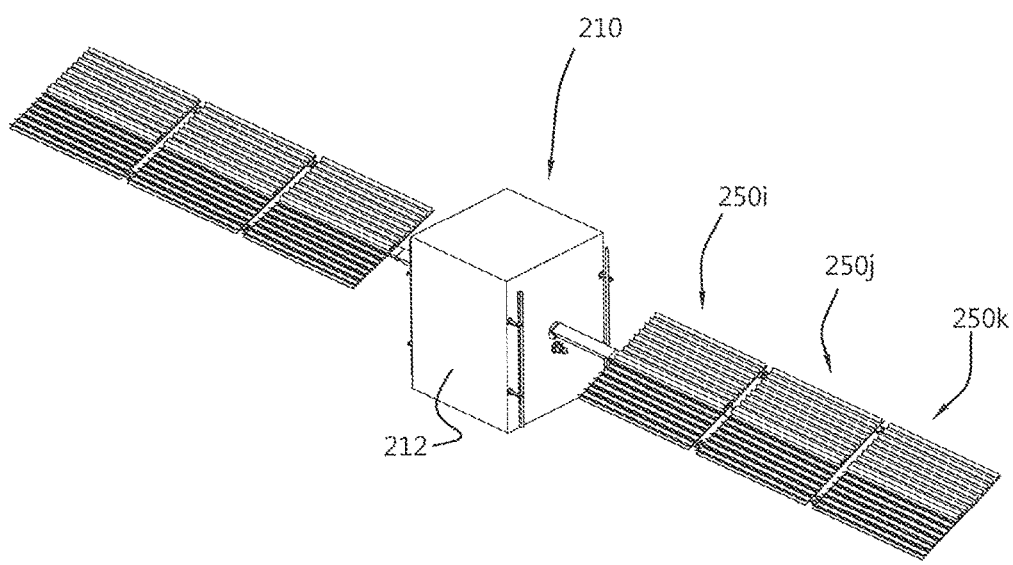
Figure 11A:
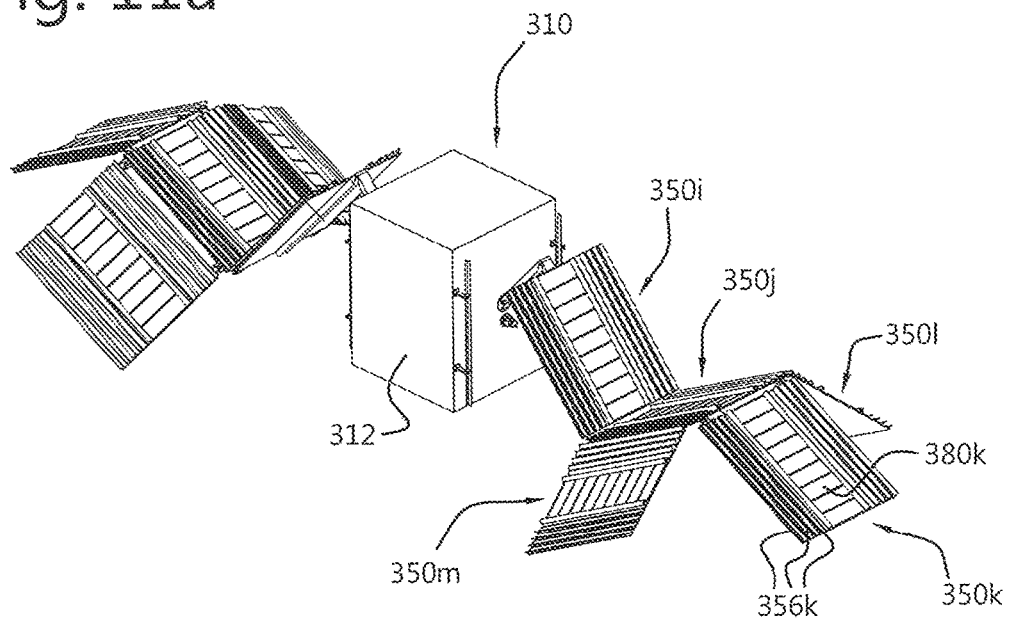
Figure 11B:
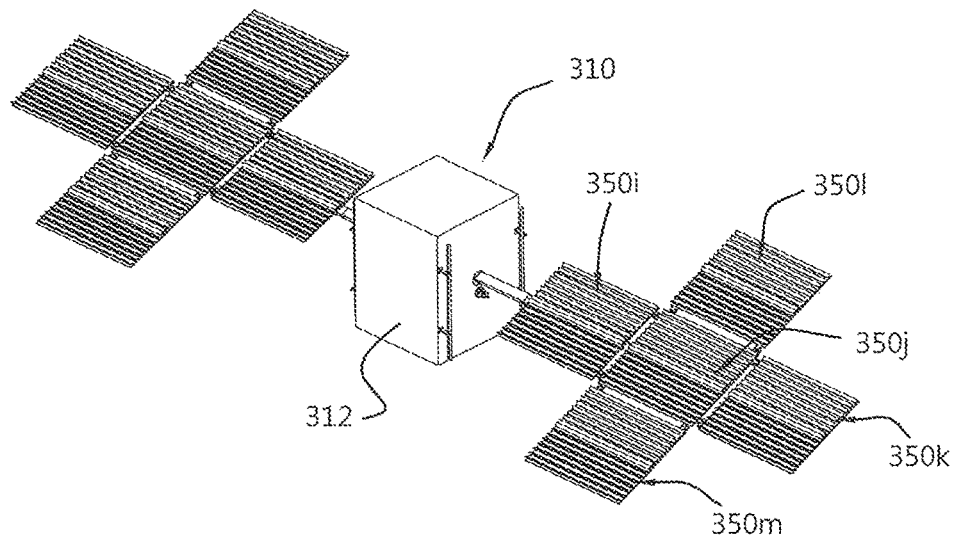

The (at least one) solar array may comprise a plurality of solar array panels, which may for example be hingedly coupled to each other to allow folding up into a stack of solar panels in a stowed state, and to allow unfolding into an co-planar sequence of panels in a deployed state. An exemplary dual-panel embodiment has been discussed herein above with reference to FIG. 6b. Other exemplary spacecraft with multi-panel configurations are illustrated in FIGS. 10a-11b. FIGS. 10a-10b depict a spacecraft 210 with a multi-panel configuration including three panels 250i, 250j, 250k per solar array subsystem, wherein the three panels 250 are hingedly coupled in a consecutive arrangement. FIG. 10a illustrates an unfolding stage of the multi-panel configuration, and FIG. 10b depicts the exemplary multi-panel configuration in the deployed state. Similarly, FIGS. 11a-11b depict a spacecraft 310 with a multi-panel configuration including five panels 350i-350m per solar array subsystem, wherein the five panels 350 are hingedly coupled with three consecutive panels 350i, 350j, 350k hingedly coupled in series and two additional panels 350l, 350m hingedly coupled to the center panel 350j, to form a panel geometry that resembles a cross or plus shape.

Hinged coupling and deployment of solar panels as such may be achieved via various ways known in the art. Exemplary coupling and deployment mechanisms are described in patent documents U.S. Pat. Nos. 6,091,016 and 6,031,178, which are herein incorporated by reference in their entireties.

In the above examples, the spacecraft was formed as a satellite unit with a satellite body has been schematically depicted as a box with multiple faces. In other embodiments, however, the spacecraft may comprise a body with a different shape.

Moreover, those skilled in the art and informed by the teachings herein will realize that the solar array according to the first aspect of the invention is not limited to satellites, but may be beneficially employed in any spacecraft that includes one or more solar arrays. Alternatively, the proposed solar array could also be included in or on landing rovers on deep space missions.

Apart from the above, in alternative embodiments, the arm or primary deployment boom that connects the solar panel to the spacecraft body may be segmented and articulated to allow a larger extent of the arm in the deployed state.

Also, different mechanisms may be employed for repositioning the concentrator reflector sheet members from the retracted state to the extended state, and for achieving the desired geometric form of the concentrator reflector sheet members in the extended state. In the above examples, the deployment members were implemented with bi-metal strips and longitudinal stringers. In alternative embodiment, the material from which the concentrator reflector sheet members are made may have geometric memory properties of itself. Yet in other embodiments, extending of the concentrator reflector sheet members may be effectuated via an (active or passive) actuation mechanism, e.g. an electrical or mechanical motor unit, which may for example be coupled to a network of cables that are connected with the various concentrator reflector sheet members.

Furthermore, the shape of the reflective surface(s) for the concentrator reflector sheet members in the extended state should not be considered limited to parabolic cylinders. Instead, reflective surfaces with other shapes would be possible, provided that the reflective surface assembly provides a radiation concentration function.

Furthermore, several of the above exemplary embodiments involve a solar array with a flexible support panel, which in a stowed state is kept fixed with respect to the spacecraft body and retained in a bent shape to provide geometrical stiffness. Depicted stowed panel configurations included cylindrically curved panel geometries with concentrator reflector sheet members extending substantially parallel with the central axis of bending curvature. In alternative embodiments, however, the concentrator reflector sheet could also be oriented differently with respect to the stowed panel geometry. The concentrator reflector sheet members may for example be fixed with one edge to the support panel and extend in a direction substantially perpendicular to the central axis of bending curvature. Alternatively or in addition, the geometry of the support panel in the stowed state may involve more complex curved shapes. Two of the above-mentioned exemplary panel bending modes are illustrated in FIGS. 12a-12d and 13a-13d respectively.

In FIGS. 12a-12d, the thin supporting panel is elastically bent along a longitudinal axis of curvature Ax, which is oriented parallel with a direction of elongation of the concentrator reflector elements 56i (i=r, s, . . . ). This bending mode is similar to the mode shown in FIGS. 7a-8b, although FIGS. 12a-12d illustrate a reversal from the deployed state towards the stowed state. This may for example occur during manufacturing and/or preparation of the spacecraft prior to launch.

Figure 12A:
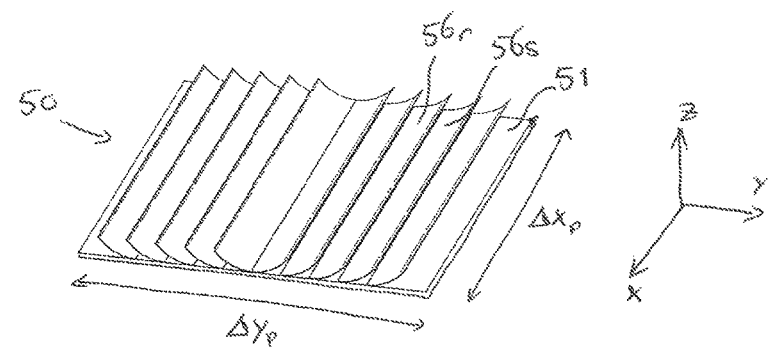
FIGS. 12a-12d show a bending mode of a solar array according to an embodiment.

FIG. 12a depicts the solar panel 50 in the deployed state. The support panel 51 has a planar (i.e. flat) shape in its mechanical equilibrium state, and the concentrator reflector members 56i are in their extended states with free edges curved upwards away from the mounting surface of the support panel 51. The support panel 51 has characteristic dimensions $\Delta Xp$, $\Delta Yp$ in the longitudinal and transversal directions X, Y along the planar of the panel 51. These characteristic in-plane dimensions $\Delta Xp$, $\Delta Yp$ may for example be 1-1½ meters.

Figure 12B:
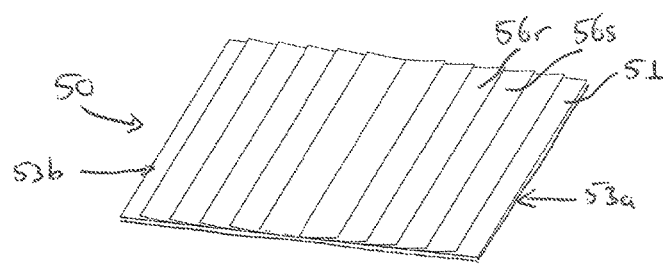

FIG. 12b depicts the solar panel 50 in an intermediate state, wherein the support panel 51 still has a planar shape, but now the concentrator reflector members 56i are retracted into a flattened and mutually overlapping arrangement along the support panel 51.

Figure 12C:
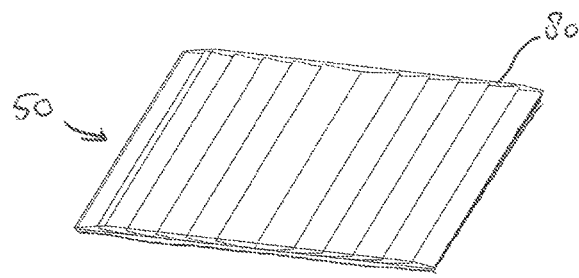

FIG. 12c depicts the solar panel 50 in a further intermediate state, wherein a cover foil 80 is applied to the flattened concentrator reflector members 56i. In alternative embodiments with at least two support panels that are mutually stacked and positioned sufficiently close in the stowed state (e.g. in FIG. 6b), the cover foil may be omitted. The cover foil may nevertheless be applied if additional mechanical protection of the concentrator reflectors is desired.

Figure 12D:
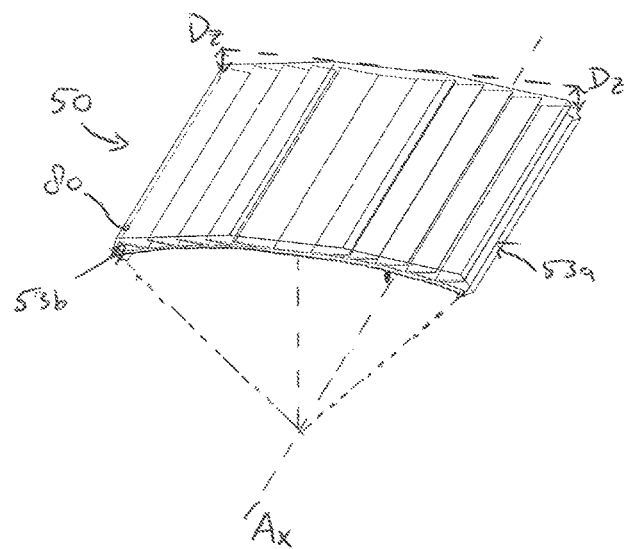

FIG. 12d depicts the solar panel 50 in the stowed state, wherein the support panel 51, the retracted concentrator reflector members 56i, and the cover foil 80 are jointly and temporarily bent into a slightly curved shape. Two opposite longitudinal edges 53a, 53b of the support panel 51 are pressed down and retained with a maximum deflection Dz away from the planar equilibrium shape. This maximum deflection Dz is preferably relatively small, e.g. about 10% of the characteristic in-plane panel dimensions $\Delta Xp$, $\Delta Yp$ (although larger maximum deflections Dz of up to 20% may be allowed under circumstances). This may be expressed by the ratio $0 < Dz/\Delta Xp \le 1/10$ or $0 < Dz/\Delta Yp \le 1/10$. The pressing down of lateral panel edges 53 towards the satellite body 12 may for example be caused by the retaining members 32, 34, as shown in FIGS. 7a-7b. The support panel 51 is retained in the curved shape around the axis of curvature Ax, which in this case is directed along the longitudinal direction X. As a result, the elongated rectangular strips forming the concentrator reflector sheet members 56 extend substantially parallel with this axis of curvature Ax.

According to an alternative bending mode shown in FIGS. 13a-13d, the solar panel 450 is elastically bent along a transversal axis of curvature Ay, which is oriented perpendicular to a direction of elongation of the concentrator reflector members 456i (i=r, s, . . . ).

FIG. 13a depicts the solar panel 450 in the deployed state. The support panel 451 has a planar shape in its mechanical equilibrium state, and the concentrator reflector members 456i are in their extended states with free edges curved upwards away from the mounting surface of the support panel 451.

FIG. 13b depicts the solar panel 450 in an intermediate state, wherein the support panel 451 is subjected to bending stresses. By bending the support panel 451 about the transversal axis of curvature Ay, the concentrator reflector sheet members 456i will be forced to transition from their extended states to their retracted states, due to anti-clastic bending energy. This panel bending automatically causes the concentrator reflector members 456i to be retracted into the flattened and mutually overlapping arrangement along the support panel 451.

FIG. 13c depicts the solar panel 450 in the stowed state, with the concentrator reflector members 456i held in the flattened mutually overlapping arrangement. The anti-clastic effect helps to keep the overlapping concentrator reflector sheet members 456i flattened against the mounting surface of the support panel 451 in the stowed state of the solar array 450. This effect obviates the need to apply further external forces (e.g. by means of a cover foil) for preventing the concentrator reflector sheet members from repositioning into their extended states.

The support panel 451 is retained in the curved shape around the axis of curvature Ay, which in this case is directed along the transversal direction Y. As a result, the elongated rectangular strips forming the concentrator reflector sheet members 456i extend substantially perpendicular to the transversal axis of curvature Ay. In this stowed state, the two opposite transversal edges 454a, 454b of the support panel 451 are held down (towards the satellite body) and retained with a maximum deflection Dz away from the planar equilibrium shape. Also in this case, the maximum deflection Dz is preferably relatively small, e.g. about 10% of the characteristic in-plane panel dimensions ΔXp, ΔYp (i.e. 0<Dz/ΔXp, Dz/ΔYp≤1/10).

FIG. 13d depicts an alternative solar panel 450 in the stowed state, wherein a cover foil 480 is applied on top of the curved support panel 451 and retracted concentrator reflector members 456i. Such cover foil 480 may optionally be applied as a protective layer for the retracted concentrator reflector members 456i, e.g. to prevent chafing in a dynamic environment.

Note that for reasons of conciseness, the reference numbers corresponding to similar elements in the various embodiments (e.g. elements 110, 210 being similar to element 10) have been collectively indicated in the claims by their base numbers only i.e. without the multiples of hundreds. However, this does not suggest that the claim elements should be construed as referring only to features corresponding to base numbers. Although the similar reference numbers have been omitted in the claims, their applicability will be apparent from a comparison with the figures.

A spacecraft with a concentrator type solar array comprising a support panel, which in the stowed state is kept fixed with respect to the spacecraft body and retained in a bent shape to provide geometrical stiffness, may be implemented as an improvement in and of its own, and its various embodiments may be subject of a divisional application. A set of clauses is presented directly below, which defines aspects and embodiments that may be subject of a divisional application.

a1. A spacecraft (10), comprising:
  a body (12);
  a solar array (50) comprising a support panel (51);
  an arm (18), which articulately couples the solar array to the body;
wherein the solar array is configured to be transitioned from a stowed state wherein the support panel is held fixed at a position near the body, to a deployed state wherein the support panel is unfolded to a position removed from the body, and wherein the support panel is at least partially flexible for retaining the support panel in a bent panel shape when the solar array is in the stowed state, to provide geometrical stiffness.

a2. The spacecraft (10) according to clause a1, comprising a hold-down mechanism (30-48) for affixing the solar array (50) to the satellite body (12) when the solar array is in the stowed state.

a3. The spacecraft (10) according to clause a1 or a2, wherein the hold-down mechanism (30-48) comprises retaining members (32, 34) configured for fixing the solar array (50) with respect to the satellite body (12) when the solar array is in the stowed state, with the support panel (51) retained in the bent panel shape.

a4. The spacecraft (10) according to clause a3, wherein the retaining members (32, 34) are configured to press down lateral edges of the support panel (51) towards the satellite body (12) when the solar array is in the stowed state, so as to retain the support panel (51) in the bent panel shape.

a5. The solar array (50) according to any one of clauses a1-a4, wherein the support panel (51) comprises a reinforcement member (52), which mechanically connects the solar array to the body (12) via the arm (18).

a6. The solar array (50) according to clause a5, wherein the reinforcement member (52) is formed as a beam with linearly symmetry, and provided along a centerline of the support panel, wherein the support panel has a substantially symmetric shape with respect to the centerline.

a7. The spacecraft (10) according any one of clauses a2-a6, as far as dependent from clause a2, wherein the hold-down mechanism (30-48) comprises:
  tensioning cabling (36) for preventing the hold-down mechanism from releasing the solar array (50) from the satellite body (12) when the solar array is in the stowed state, and
  a thermal knife (30) for cutting the tensioning cabling and releasing the hold-down mechanism to let the solar array (50) assume the deployed state.

LIST OF REFERENCE SYMBOLS

Similar reference numbers that have been used in the description to indicate similar elements (but differing only in the hundreds) have been omitted from the list below, but should be considered implicitly included.

10 satellite unit
12 satellite body
14 lateral body surface
16 joint
18 arm (boom)
20 further joint
30 locking mechanism (e.g. thermal knife unit or pyro-unit)
32 retaining member
33 engagement ledge
34 further retaining member
35 further engagement ledge
36 tensioning cable
37 cable biasing member (e.g. helical spring)
39 hold-down aperture
40 base
42 guide member
44 biasing member (e.g. coil spring)
46 clamping member
48 cable aperture
50 solar array
51 support member (e.g. support panel)
52 reinforcement member (e.g. beam)
53 longitudinal panel edge
54 transversal panel edge
55 front panel surface
56 concentrator reflector sheet member (e.g. flexible strip)
57 fixed edge
58 free edge
59 front surface (e.g. front area with reflector)
60 rear surface (e.g. rear area with PV cell)
61 reflective area
62 deployment member
64 PV cell
70 incident solar radiation
72 reflected solar radiation
74 focal region of cell area
80 protection cover foil
Ax longitudinal axis of curvature
Ay transversal axis of curvature
X first direction (longitudinal direction)
Y second direction (transversal direction)
Z third direction
Δx PV cell length Δy PV cell width
ΔXp panel length
ΔYp panel width

What is claimed is:

1. A solar array for a spacecraft, comprising:
a solar concentrator that is provided with photovoltaic cells and reflective areas configured for reflecting solar radiation towards the photovoltaic cells, wherein the reflective areas and the photovoltaic cells are provided on opposite surfaces of concentrator reflector sheet members, which are repositionable from a retracted state wherein the concentrator reflector sheet members are in a substantially flat arrangement, to an extended state wherein the concentrator reflector sheet members are raised to allow the reflective areas to reflect solar radiation towards the exposed photovoltaic cells, and
a support panel defining a mounting surface onto which the concentrator reflector sheet members are attached so that the support panel and concentrator reflector sheet members form an assembly, the concentrator reflector sheet members being flexible to allow bending away from the support panel to assume the extended state;
wherein the support panel has a planar shape in mechanical equilibrium corresponding to a deployed state of the solar array, said planar shape enabling the concentrator reflector sheet members to assume the extended state wherein the reflective areas extend in a linearly symmetric manner along the support panel and are co-aligned so that parallel light rays from the sun that impinge on said reflective areas are reflected and concentrated towards parallel focal lines and towards the exposed photovoltaic cells;
and wherein the support panel is elastically bendable into a curved shape corresponding to a stowed state of the solar array and a retracted state of the concentrator reflector sheet members, said curved shape providing geometrical stiffness and an increased resonance frequency of the assembly.

2. The solar array according to claim 1, comprising a protection cover foil, which is adapted to cover the concentrator reflector sheet members in the retracted state and to prevent the concentrator reflector sheet members from repositioning into the extended state.

3. The solar array according to claim 1, wherein the concentrator reflector sheet members comprise:
a first concentrator reflector sheet member with a first front surface and a first rear surface, wherein one of said reflective areas is provided at the first front surface;
a second concentrator reflector sheet member with a second front surface and a second rear surface, wherein one of said photovoltaic cells is provided at the second rear surface;
wherein in the retracted state, the first and second concentrator reflector sheet members are in a mutually overlapping arrangement with the second rear surface covering at least part of the first front surface, and wherein in the extended state, the first and second concentrator reflector sheet members are raised to expose the photovoltaic cell on the second concentrator reflector sheet member and to allow the reflective area to reflect solar radiation towards the exposed photovoltaic cell.

4. The solar array according to claim 1, wherein the concentrator reflector sheet members are formed as elongated rectangular strips, each comprising a first alongside edge that is mechanically coupled to the support member, and a second alongside edge opposite to the first alongside edge, which is suspended freely and bendable away from the support member to allow repositioning from the retracted state to the extended state.

5. The solar array according to claim 1, wherein in the extended state, the front surfaces of the concentrator reflector sheet members form reflective parabolic cylindrical areas for receiving solar radiation, and wherein the photovoltaic cells are arranged on the rear surfaces of the concentrator reflector sheet members at locations at or near focal areas of reflective parabolic cylindrical areas on adjacent concentrator reflector sheet members.

6. The solar array according to claim 1, wherein the concentrator reflector sheet members are provided with memory metal members configured for repositioning the concentrator reflector sheet members from the retracted state to the extended state.

7. The solar array according to claim 1, wherein the support panel comprises a reinforcement member on a side opposite to the mounting surface, wherein the reinforcement member is adapted for mechanically connecting the solar array to a body of the spacecraft, and wherein the reinforcement member is preferably formed as a beam with linear symmetry and provided along a centerline of the support panel.

8. A spacecraft, comprising:
a body;
a solar array, comprising a support panel and concentrator reflector sheet members configured for repositioning from a retracted state into an extended state, and in accordance with claim 1, and
an arm, which couples the solar array to the body;
wherein the solar array is configured to be transitioned from a stowed state wherein the concentrator reflector sheet members are in the retracted state, to a deployed state wherein the concentrator reflector sheet members are in the extended state.

9. The spacecraft according to claim 8, wherein the support panel has a characteristic size in a direction along a plane of the panel, wherein the support panel is retained in a curved shape in the stowed state with a maximum deflection away from a planar shape in the deployed state, and wherein a ratio R of the maximum deflection to the characteristic size complies with $0 < R \leq 1/5$.

10. The spacecraft according to claim 8, wherein the support panel is retained in the curved shape around an axis of curvature in the stowed state of the solar array, wherein the concentrator reflector sheet members are formed as elongated rectangular strips, each comprising a first alongside edge that is mechanically coupled to the support member, and a second alongside edge opposite to the first alongside edge, which is suspended freely and bendable away from the support member to allow repositioning from the retracted state to the extended state, and wherein the elongated rectangular strips extend substantially perpendicular to or parallel with the axis of curvature.

11. The spacecraft according to claim 8, wherein the solar array comprises a reinforcement member on a side opposite to the mounting surface, wherein the reinforcement member is adapted for mechanically connecting the solar array to a body of the spacecraft, and wherein the reinforcement member is formed as a beam with linear symmetry provided along a centerline of the support panel.

12. The spacecraft according to claim 8, comprising a hold-down mechanism for affixing the solar array to the spacecraft body in the stowed state, wherein the hold-down mechanism comprises retaining members configured for fixing the solar array with respect to the spacecraft body in the stowed state, with the support panel retained in the curved shape.

13. The spacecraft according to claim 12, wherein the hold-down mechanism comprises:
   tensioning cabling for preventing the hold-down mechanism from releasing the solar array from the spacecraft body in the stowed state, and
   a thermal knife for cutting the tensioning cabling and releasing the hold-down mechanism to let the solar array assume the deployed state.

14. The spacecraft according to claim 12, wherein the hold-down mechanism comprises only one hold-down and locking point for affixing the solar array to the spacecraft body in the stowed state.

15. The spacecraft according to claim 12, wherein the retaining members are configured to press down lateral edges of the support panel towards the spacecraft body when the solar array is in the stowed state, so as to temporarily retain the support panel in the curved shape.

16. The spacecraft according to claim 15, comprising the solar array with a protection cover foil that is adapted to cover the concentrator reflector sheet members in the retracted state and to prevent the concentrator reflector sheet members from repositioning into the extended state, wherein the protection cover foil is pre-tensioned for inducing self-removal to allow the concentrator reflector sheet members to reposition into the extended state, and wherein the retaining members are configured for keeping the protection cover foil pressed onto the concentrator reflector sheet members in the retracted state.

17. A solar array for a spacecraft, comprising:
   a solar concentrator that is provided with photovoltaic cells and reflective areas configured for reflecting solar radiation towards the photovoltaic cells, wherein the reflective areas and the photovoltaic cells are provided on opposite surfaces of concentrator reflector sheet members, which are repositionable from a retracted state wherein the concentrator reflector sheet members are in a substantially flat arrangement, to an extended state wherein the concentrator reflector sheet members are raised to allow the reflective areas to reflect solar radiation towards the exposed photovoltaic cells, and
   a protection cover foil, adapted to cover the concentrator reflector sheet members in the retracted state and to prevent the concentrator reflector sheet members from repositioning into the extended state.

18. The solar array according to claim 17, further comprising a support panel with a mounting surface onto which the concentrator reflector sheet members are attached, the concentrator reflector sheet members being flexible to allow bending away from the support panel to assume the extended state.

19. The solar array according to claim 18, wherein the concentrator reflector sheet members are formed as elongated rectangular strips, each strip comprising a first alongside edge that is mechanically coupled to the support panel, and a second alongside edge opposite to the first alongside edge, which is suspended freely and bendable away from the support panel to allow repositioning from the retracted state to the extended state,
   wherein in the stowed state of the solar array, the support panel is retainable in the curved shape around an axis of curvature, and wherein the elongated rectangular strips extend substantially perpendicular to or parallel with the axis of curvature.

* * * * *